US011128030B2

(12) United States Patent
Kim et al.

(10) Patent No.: US 11,128,030 B2
(45) Date of Patent: Sep. 21, 2021

(54) ANTENNA MODULE AND ELECTRONIC DEVICE INCLUDING THE SAME

(71) Applicant: SAMSUNG ELECTRO-MECHANICS CO., LTD., Suwon-si (KR)

(72) Inventors: Hong In Kim, Suwon-si (KR); Hyung Ho Seo, Suwon-si (KR); Young Kyoon Im, Suwon-si (KR); Kyu Bum Han, Suwon-si (KR); Jeong Ki Ryoo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 174 days.

(21) Appl. No.: 16/504,701

(22) Filed: Jul. 8, 2019

(65) Prior Publication Data

US 2020/0112081 A1 Apr. 9, 2020

(30) Foreign Application Priority Data

Oct. 4, 2018 (KR) .................. 10-2018-0118271
Dec. 28, 2018 (KR) .................. 10-2018-0172162

(51) Int. Cl.
*H01Q 1/22* (2006.01)
*H01Q 1/38* (2006.01)
(Continued)

(52) U.S. Cl.
CPC .......... *H01Q 1/2283* (2013.01); *H01L 23/66* (2013.01); *H01L 24/16* (2013.01); *H01Q 1/22* (2013.01);
(Continued)

(58) Field of Classification Search
CPC ...... H01Q 1/2283; H01Q 1/38; H01Q 9/0407; H01Q 21/0006; H01Q 1/22; H01Q 9/04;
(Continued)

(56) References Cited

U.S. PATENT DOCUMENTS

2010/0240327 A1* 9/2010 Lambrecht ............ H01Q 1/243
455/95
2016/0049723 A1* 2/2016 Baks ................... H01Q 1/2291
343/848
(Continued)

FOREIGN PATENT DOCUMENTS

| JP | 2003-087022 A | 3/2003 |
| KR | 10-2016-0112154 A | 9/2016 |
| WO | WO 2017/018134 A1 | 2/2017 |

OTHER PUBLICATIONS

Korean Office Action dated Aug. 29, 2019 in corresponding Korean Patent Application No. 10-2018-0172162 (5 pages in English, 5 pages in Korean).

*Primary Examiner* — Hai V Tran
(74) *Attorney, Agent, or Firm* — NSIP Law

(57) ABSTRACT

An antenna module includes an integrated circuit (IC) package, a first antenna package, a second antenna package, and a connection member. The IC package includes an IC and mounting electrical connection structures. The first antenna package includes a first patch antenna pattern, a first feed via connected to the first patch antenna pattern, and a first antenna dielectric layer surrounding at least a portion of the first feed via. The second antenna package includes a second patch antenna pattern, a second feed via connected to the second patch antenna pattern, and a second antenna dielectric layer surrounding at least a portion of the second feed via, and disposed to be spaced apart from the first antenna package. The connection member, connecting the IC to the first feed via and the second feed via, connects to the mounting electrical connection structures, and having a stacked structure.

20 Claims, 12 Drawing Sheets

(51) Int. Cl.
  *H01Q 9/04* (2006.01)
  *H01Q 21/00* (2006.01)
  *H05K 1/14* (2006.01)
  *H05K 1/18* (2006.01)
  *H01L 23/66* (2006.01)
  *H01L 23/00* (2006.01)

(52) U.S. Cl.
  CPC .............. *H01Q 1/38* (2013.01); *H01Q 9/04* (2013.01); *H01Q 9/0407* (2013.01); *H01Q 9/0485* (2013.01); *H01Q 21/00* (2013.01); *H01Q 21/0006* (2013.01); *H05K 1/147* (2013.01); *H05K 1/181* (2013.01); *H01L 2224/16245* (2013.01)

(58) Field of Classification Search
  CPC ...... H01Q 9/0485; H01Q 21/00; H05K 1/181; H01L 23/66
  USPC ..................................................... 343/700 R
  See application file for complete search history.

(56) References Cited

U.S. PATENT DOCUMENTS

| | | | |
|---|---|---|---|
| 2016/0276734 A1* | 9/2016 | Jin | H01Q 1/2283 |
| 2017/0040266 A1* | 2/2017 | Lin | H01L 23/5383 |
| 2018/0254555 A1* | 9/2018 | Sotoma | H01Q 25/00 |
| 2019/0067220 A1* | 2/2019 | Wan | H01L 23/66 |

* cited by examiner

ANTENNA MODULE AND ELECTRONIC DEVICE INCLUDING THE SAME

CROSS-REFERENCE TO RELATED APPLICATIONS

This application claims benefit under 35 USC 119(a) of Korean Patent Application No. 10-2018-0118271 filed on Oct. 4, 2018 and Korean Patent Application No. 10-2018-0172162 filed on Dec. 28, 2018 in the Korean Intellectual Property Office, the entire disclosure of which is incorporated herein by reference for all purposes.

BACKGROUND

1. Field

The present disclosure relates to an antenna module and an electronic device including the same.

2. Description of Related Art

Data traffic in mobile communications is rapidly increases every year. Technological developments are being actively conducted to support the transfer of such rapidly increasing data in a real time wireless network. For example, data from applications based on IoT (Internet of Things), augmented reality (AR), virtual reality (VR), live VR/AR combined with SNS, autonomous driving, sync view (a real time image of a user's point of view transmitted using an ultra small camera), and the like need communications (e.g., 5G communications, mmWave communications, etc.) to support transmission and reception of large amounts of data.

Millimeter wave (mmWave) communications including 5th (5G) communications have been actively researched for the commercialization/standardization of an antenna module that seamlessly implements millimeter wave communications.

Since radio frequency (RF) signals in high frequency bands (e.g., 28 GHz, 36 GHz, 39 GHz, 60 GHz, and the like) are easily absorbed or reflected during a transmission process, which leads to losses, the quality of transmission may severely deteriorate as distance increases. Therefore, an antenna for communicating in high frequency bands requires a technical approach different from a conventional antenna technology, and may require special technological developments such as a separate power amplifier for securing an antenna gain, integrating an antenna and RFIC, securing effective isotropic radiated power (EIRP), and the like.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an antenna module includes an integrated circuit (IC) package, a first antenna package, a second antenna package, and a connection member. The integrated circuit (IC) package includes an IC and mounting electrical connection structures. The first antenna package includes a first patch antenna pattern, a first feed via connected to the first patch antenna pattern, and a first antenna dielectric layer surrounding at least a portion of the first feed via. The second antenna package includes a second patch antenna pattern, a second feed via connected to the second patch antenna pattern, and a second antenna dielectric layer surrounding at least a portion of the second feed via, and disposed to be spaced apart from the first antenna package. The connection member, connecting the IC to the first feed via and the second feed via, connects to the mounting electrical connection structures, and having a stacked structure. The connection member includes a first region disposed between the first antenna package and the IC package, a second region providing an arrangement surface of the second antenna package, and a third region connecting between the first region and the second region.

The direction in which a plane of the first patch antenna pattern is directed may be different from a direction in which a plane of the second patch antenna pattern is directed.

The connection member may include a signal path dielectric layer that is more flexible than the first antenna dielectric layer.

The antenna module may further include a third antenna package disposed on a surface different from the arrangement surface on which the second antenna package is disposed in the second region of the connection member.

The antenna module may further include a second IC package including a second IC and disposed on a surface different from the arrangement surface on which the second antenna package is disposed in the second region of the connection member.

The antenna module may further include passive components disposed on a surface different from the arrangement surface on which the second antenna package is disposed in the second region of the connection member, and an encapsulant may encapsulate at least portions of the passive components.

The IC package may further include a core member providing a surface disposed in the first region of the connection member and another surface on which the mounting electrical connection structures are disposed, and may be disposed to be spaced apart from the IC.

The IC package may further include a heat slug disposed on an inactive surface of the IC, and the IC may be connected to the connection member through an active surface.

The IC package may further include heat dissipating structures connected to the heat slug, and the heat slug may be disposed between the IC and the heat dissipating structures.

The second antenna package may further include a second coupling structure surrounding at least a portion of the second patch antenna pattern.

The second antenna package may further include a second coupling patch pattern disposed to be overlapped with the second patch antenna pattern when viewed in a stacked direction of the connection member.

In another general aspect, an electronic device includes a set substrate disposed in a case and an antenna module. The antenna module, disposed in the case and connected to the set substrate, includes an integrated circuit (IC) package, a first antenna package, a second antenna package, and a second antenna package. The IC package includes an IC and mounting electrical connection structures. The first antenna package includes a first patch antenna pattern, a first feed via connected to the first patch antenna pattern, and a first antenna dielectric layer surrounding at least a portion of the first feed via. The second antenna package includes a second patch antenna pattern, a second feed via connected to the second patch antenna pattern, and a second antenna dielectric layer surrounding at least a portion of the second feed via, and disposed to be spaced apart from the first antenna package. The connection member connects the IC and the first and second feed vias, and has a stacked structure connected to the mounting electrical connection structures. The connection member includes a first region disposed between the first antenna package and the IC package, a second region providing an arrangement surface of the second antenna package, and a third region connecting between the first region and the second region.

The IC package further may include a core member disposed between the first region of the connection member and the set substrate, and the mounting electrical connection structures may be disposed between the core member and the set substrate.

The IC package may further include a heat slug disposed between the IC and the set substrate and connected to the set substrate.

The first patch antenna pattern may be disposed closer to a first surface of the case than a second surface of the case, and the second patch antenna pattern may be disposed closer to the second surface of the case than the first surface of the case.

The electronic device may further include a fourth antenna package, wherein the connection member may further include a fourth region providing an arrangement surface of the fourth antenna package, and a fifth region connecting between the fourth region and the second region.

In another general aspect, an antenna module includes a connection member, a first antenna package, a second antenna package, and an integrated circuit (IC) package. The first antenna package includes a first patch antenna pattern, a first feed via connected to the first patch antenna pattern, and a first antenna dielectric layer surrounding at least a portion of the first feed via, and disposed on a first surface of the connection member. The second antenna package includes a second patch antenna pattern, a second feed via connected to the second patch antenna pattern, and a second antenna dielectric layer surrounding at least a portion of the second feed via, and disposed on a surface of the connection member to be spaced apart from the first antenna package. The IC package includes an IC and mounting electrical connection structures, and is disposed on a second surface of the connection member. The second surface is opposite the first surface, and the connection member connects the IC to the first feed via and the second feed via, and connects to the mounting electrical connection structures.

The connection member may have a stacked structure.

The second antenna package may be disposed on the first surface of the connection member.

A direction in which a plane of the first patch antenna pattern is directed may be different from a direction in which a plane of the second patch antenna pattern is directed.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
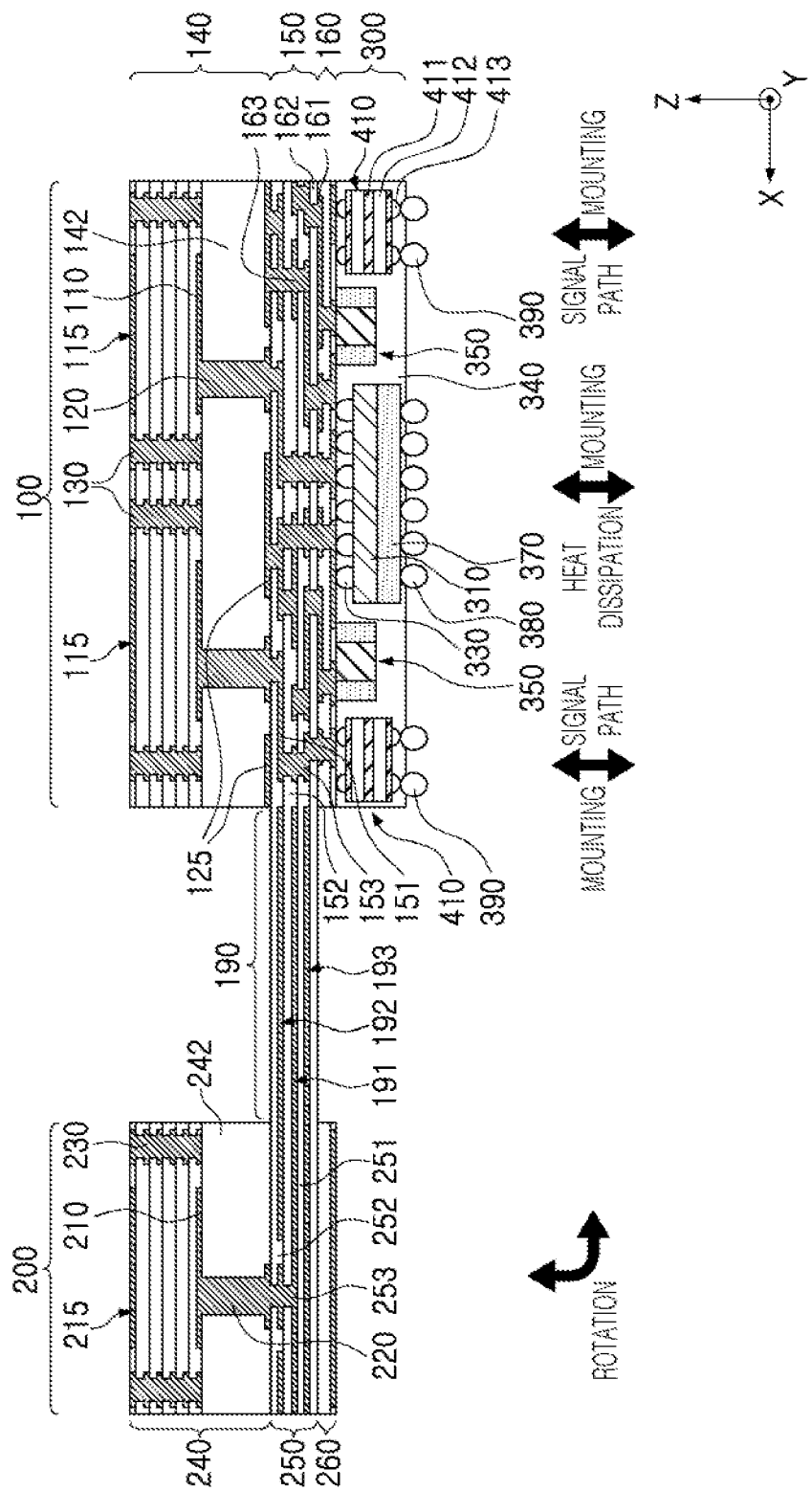
FIG. 1 is a side view illustrating an example of an antenna module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a side view illustrating an example of an antenna module.

Referring to FIG. 1, an antenna module in the present disclosure may include a base module 100, an expansion module 200, and a connection member that electrically connects between the base module 100 and the expansion module 200. The connection member may include first, second, and third regions 150, 250, and 190.

The base module 100 may include a first antenna package 140, the first region 150 of the connection member, and an IC package 300, and may be mounted on a set substrate through mounting electrical structures 390.

The base module 100 may receive a base signal from the set substrate to generate a radio frequency (RF) signal, and may remotely transmit a portion of the generated RF signal. Similarly, the base module 100 may remotely receive a portion of the RF signal to generate the base signal, and may transmit the generated base signal to the set substrate. Here, the base signal may be an intermediate frequency (IF) signal or a baseband signal.

The base module 100 may transmit and receive the RF signal in a z direction. For example, the z direction may be set to a direction opposing a display direction of an electronic device (e.g., a portable terminal).

In general, since a user of the electronic device (e.g., the portable terminal) holds the electronic device in a display and opposing-display direction to use the electronic device, the user may block the z direction by hand. In this case, since the hand may interfere with the remote transmission and reception of the RF signals, it may cause deterioration of the communication quality of the electronic device or increase power consumption of the electronic device. The antenna module according to examples in the present disclosure may have a structure capable of efficiently transmitting and receiving the RF signals even in directions in addition to the z direction.

The expansion module 200 may include a second antenna package 240 and a second region 250 of the connection member, and may not be mounted on the set substrate.

The expansion module 200 may remotely transmit other portions of the RF signal generated by the base module 100, and may remotely receive other portions of the RF signal to transmit the received RF signal to the base module 100.

The expansion module 200 may transmit and receive the RF signal in a direction according to an arrangement posture.

Referring to FIG. 1, the antenna module in the present disclosure may further include a third region 190 of the connection member that electrically connects between the first region 150 of the connection member of the base module 100 and the second region 250 of the connection member of the expansion module 200.

The first, second, and third regions 150, 250, and 190 of the connection member may form a stacked structure. Accordingly, the connection member may have a relatively short length in the z direction, may reduce electrical lengths from the IC 310 to first and second patch antenna patterns 110 and 210, and may reduce transmission loss of the RF signal.

The third region 190 of the connection member may be more flexibly bent than the base module 100 and the expansion module 200. For example, the base module 100, the third region 190 of the connection member, and the expansion module 200 may be implemented by a rigid-flexible printed circuit board (RFPCB), but are not limited thereto.

For example, first and second antenna dielectric layers 142 and 152 included in the base module 100 and the expansion module 200 may be formed of pregreg, FR4, low temperature co-fired ceramic (LTCC), or glass, and a dielectric layer included in the third region 190 of the connection member may be formed of liquid crystal polymer or polyimide which is more flexible than pregreg, FR4, LTCC, or glass, but are not limited thereto, and may vary depending on design specifications (e.g., flexibility, dielectric constant, easiness of bonding between multiple substrates, durability, cost, etc.).

Since the posture of the base module 100 may be fixed to the set substrate, the expansion module 200 may rotate about the third region 190 of the connection member when bent.

For example, the expansion module 200 may rotate by 90 degrees with respect to the base module 100 to transmit and receive the RF signal in an x direction and/or a y direction.

Depending on a design, the expansion module 200 may rotate up to about 180 degrees with respect to the base module 100 to transmit and receive the RF signal in a −z direction.

That is, the transmission and reception direction of the RF signal of the expansion module 200 may be easily and variously set.

Therefore, the antenna module according to examples in the present disclosure may not only transmit and receive the RF signals in the z direction by using the base module 100 but also efficiently transmit and receive the RF signals in directions other than the z direction by using the expansion module 200.

In addition, the separation distance between the base module 100 and the expansion module 200 may be variously set based on requirements and the folding of the third region 190 of the connection member.

Therefore, the antenna module according to an example in the present disclosure may be configured so that the expansion module 200 is disposed in a position at which the RF signals may be efficiently transmitted and received in an electronic device (e.g., a portable terminal), and may more efficiently transmit and receive the RF signals.

The first antenna package 140 may include at least portions of a first patch antenna pattern 110, a first coupling patch pattern 115, a first feed via 120, a first ground layer 125, a first coupling structure 130, and a first antenna dielectric layer 142.

The second antenna package 240 may include at least portions of a second patch antenna pattern 210, a second coupling patch pattern 215, a second feed via 220, a second coupling structure 230, and a second antenna dielectric layer 242.

Each of the first and second patch antenna patterns 110 and 210 may be electrically connected to one end of each of the first and second feed vias 120 and 220, respectively. The number of the first and second patch antenna patterns 110 and 210, respectively, may be plural. A gain of each of the first and second patch antenna patterns 110 and 210 may be improved as the number of the first and second patch antenna patterns 110 and 210, respectively, increases.

The first and second patch antenna patterns 110 and 210 may transmit and receive the RF signals through planes (e.g., an upper surface and a lower surface). Since the RF signals transmitted and received through a lower plane may be reflected by the first ground layer 125 and the second ground layer, the first and second patch antenna patterns 110 and 210 may concentrate a radiation pattern in a direction toward the upper plane.

Since the first and second patch antenna patterns 110 and 210 may have a relatively larger plane than other types of antennas (e.g., a dipole antenna, a monopole antenna) and may more easily concentrate a reflection pattern in one direction, the first and second patch antenna patterns 110 and 210 may have a greater gain and bandwidth than other types of antennas.

The first and second coupling patch patterns 115 and 215 may be disposed to overlap the first and second patch antenna patterns 110 and 210 in the z direction (or stacked direction), and may be electromagnetically coupled to the first and second patch antenna patterns 110 and 210. A combination structure of the patch antenna patterns and the coupling patch patterns may improve the gain by expanding the transmission and reception plane of the RF signal, and may expand the bandwidth by using a capacitance formed by the patch antenna patterns and the coupling patch patterns.

The first and second feed vias 120 and 220 may be connected to the first and second regions 150 and 250 of the connection member, respectively. When the number of the first and second patch antenna patterns 110 and 210, respectively, is plural, the number of the first and second feed vias 120 and 220, respectively, may also be plural.

The length of each of the first and second feed vias 120 and 220 may be set based on an optimal separation distance (e.g., ½ times, ¼ times of a wavelength of the RF signal) between the first and second patch antenna patterns 110 and 210 and the first and second ground layers.

The first ground layer 125 may be disposed below the first patch antenna pattern 110, and may act as a reflector for the first patch antenna pattern 110 to further concentrate the RF signals upwardly or tangentially.

The first and second coupling structures 130 and 230 may surround, at least, a portion of the first and second patch antenna patterns 110 and 210, respectively, in the horizontal direction (e.g., the x direction and/or the y direction).

The first and second coupling structures 130 and 230 may reflect RF signals which are leaked to side surfaces (e.g., in the x direction and/or the y direction) of the first and second patch antenna patterns 110 and 210, respectively, or change a transmission direction of the leaked RF signals to thereby more concentrate the leaked RF signals upwardly.

When the number of the first and second patch antenna patterns 110 and 210 is plural, the first and second coupling structures 130 and 230 may reduce electromagnetic interference between the patch antenna patterns. Accordingly, beamforming efficiency of the first and second patch antenna patterns 110 and 210 may be improved, and the gain of the first and second patch antenna patterns 110 and 210 may be improved.

The first and second antenna dielectric layers 142 and 242 may surround at least a portion of the first and second feed vias 120 and 220, respectively.

The first and second antenna dielectric layers 142 and 242 may have a dielectric constant Dk greater than air and may have insulation characteristics. The dielectric constants of the first and second antenna dielectric layers 142 and 242 may be set to be large for size reduction of the first and second antenna packages 140 and 240, and may also be set to be small for the bandwidth or transmission and reception efficiency of the first and second antenna packages 140 and 240.

The first and second regions 150 and 250 of the connection member may be disposed below the first and second antenna packages 140 and 150, respectively, and may be connected to each other through the third region 190 of the connection member.

The first and second regions 150 and 250 of the connection member may have at least portions of first and second signal path wiring layers 151 and 251, first and second signal path dielectric layers 152 and 252, and first and second signal path wiring vias 153 and 253.

The first and second signal path wiring layers 151 and 251 may be connected to the first and second feed vias 120 and 220, respectively.

The first and second signal path dielectric layers 152 and 252 may each have insulation characteristics, and may have greater flexibility than the first and second antenna dielectric layers 142 and 242. That is, the first and second regions 150 and 250 of the connection member may be integrated with the third region 190 of the connection member.

The first and second signal path wiring vias 153 and 253 may be electrically connected to the first and second signal path wiring layers 151 and 251.

Here, the first signal path wiring via 153 may be connected to a circuit support member 160.

The circuit support member 160 may be disposed between the first region 150 of the connection member and the IC package 300, and may include at least portions of a circuit wiring layer 161, a circuit dielectric layer 162, and a circuit wiring via 163.

The circuit wiring layer 161 may electrically connect between the first signal path wiring layer 151 and the IC 310. In addition, the circuit wiring layer 161 may electrically connect between the IC 310 and passive components 350. In addition, the circuit wiring layer 161 may provide an electrical ground to the IC 310.

The circuit dielectric layer 162 may have a dielectric constant Dk greater than air and may have insulation characteristics. Depending on a design, the circuit dielectric layer 162 may have a low dissipation factor Df to reduce the loss of the RF signals.

The circuit wiring via 163 may be connected between the circuit wiring layer 161 and the first signal path wiring layer 151, or may be connected between the circuit wiring layer 161 and the IC 310 and/or the passive components 350.

The third region 190 of the connection member may include an RF signal expansion path wiring 191 and RF signal expansion path ground layers 192 and 193.

The RF signal expansion path wiring 191 may be electrically connected between the first and second signal path wiring layers 151 and 251. That is, the RF signal expansion path wiring 191 may provide an RF signal expansion path between the base module 100 and the expansion module 200.

The RF signal expansion path ground layers 192 and 193 may be disposed on and/or below the RF signal expansion path wiring 191. Accordingly, the RF signal expansion path wiring 191 may be protected from external electromagnetic noises.

A supporting member 260 may be fixed in the electronic device (e.g., the portable terminal) of the expansion module 200. For example, the supporting member 260 may be attached to the electronic device by including an adhesive member, or may be physically coupled to the electronic device by including a physical coupling member.

The IC package 300 may provide a mounting structure on the set substrate of the base module 100, provide an input and output path of a base signal for the set substrate, provide an arrangement space of the IC 310, and have a structure that efficiently discharges heat generated in the IC 310.

The IC 310 may receive the base signal to generate the RF signal, or may receive the RF signal to generate the base signal. For example, the IC 310 may perform at least a portion of frequency conversion, amplification, filtering, phase control, and power generation for the received signal to generate a converted signal.

For example, the IC 310 may have an active surface (e.g., an upper surface) electrically connected to the first region 150 of the connection member, and an inactive surface (e.g., a lower surface) providing an arrangement space of a heat slug 370.

The IC electrical connection structures 330 may provide an electrical coupling structure between the IC 310 and the circuit support member 160. For example, the IC electrical connection structures 330 may have a structure such as solder balls, pins, lands, and pads.

Since an encapsulant 340 may encapsulate at least a portion of the IC and the passive components 350, respectively, the encapsulant 340 may protect the IC 310 and the passive components 350 from external factors. For example, the encapsulant 340 may be formed of a photo imageable encapsulant (PIE), Ajinomoto build-up film (ABF), epoxy molding compound (EMC), or the like.

The passive components 350 may provide capacitance, inductance, or resistance to the IC 310. For example, the passive components 350 may include at least a portion of a capacitor (e.g., a multilayer ceramic capacitor (MLCC)), an inductor, and a chip resistor. Depending on a design, the passive components 350 may separately perform some operations (e.g., filtering, amplification) for the IC 310.

The mounting electrical connection structures 390 may provide an electrical coupling structure between the IC package 300 and the set substrate, and may support the mounting of the base module 100 on the set substrate. The mounting electrical connection structures 390 may provide a base signal input and output path for the set substrate, and may have a structure similar to the IC electrical connection structures 330.

The core member 410 may have a surface disposed on the first region 150 of the connection member and another surface on which the mounting electrical connection structures 390 are disposed, and may be disposed to be spaced apart from the IC 310.

That is, the core member 410 may be disposed between the first region 150 of the connection member and the set substrate, and the mounting electrical connection structures 390 may be disposed between the core member 410 and the set substrate.

For example, the core member 410 may surround at least a portion of the IC 310, may be electrically connected to the mounting electrical connection structures 390, may provide a base signal transmission path, and may support the base module 100.

Depending on a design, the core member 410 may be implemented as a fan-out panel level package (FOPLP) to improve base signal transmission path efficiency (e.g., a loss rate, ground stability) or to provide electromagnetic shielding performance.

Meanwhile, the core member 410 may include at least portions of a core wiring 411, a core dielectric layer 412, and a core via 413 that correspond to the circuit wiring layer 161, the circuit dielectric layer 162, and the circuit wiring via 163, respectively.

The heat slug 370 may absorb the heat generated in the IC 310, and transfer the absorbed heat to heat dissipating structures 380. For example, the heat slug 370 may be implemented as a metal slag or heat spreader to improve absorbing and dissipating efficiency of heat.

The heat slug 370 may be disposed between the IC 310 and the set substrate, and may be electrically connected to the set substrate through the heat dissipating structures 380.

The heat dissipating structures 380 may be electrically connected to the heat slug 370 to dissipate the heat transferred from the heat slug 370 to the set substrate. For example, the heat dissipating structures 380 may have a structure corresponding to the mounting electrical connection structures 390, and a plurality of heat dissipating structures 380 may form a structure of a heat sink to further improve heat dissipating efficiency.

The heat slug 370 and the heat dissipating structures 380 may dissipate the heat generated in the IC 310 according to the RF signal transmission and reception of the expansion module 200 as well as the heat generated in the IC 310 according to the RF signal transmission and reception of the base module 100.

Accordingly, since the expansion module 200 does not need to have a structure for dissipating heat, the arrangement posture may be more freely set, and arrangement stability may be improved by using the supporting member 260 more efficiently.

Figure 2A:
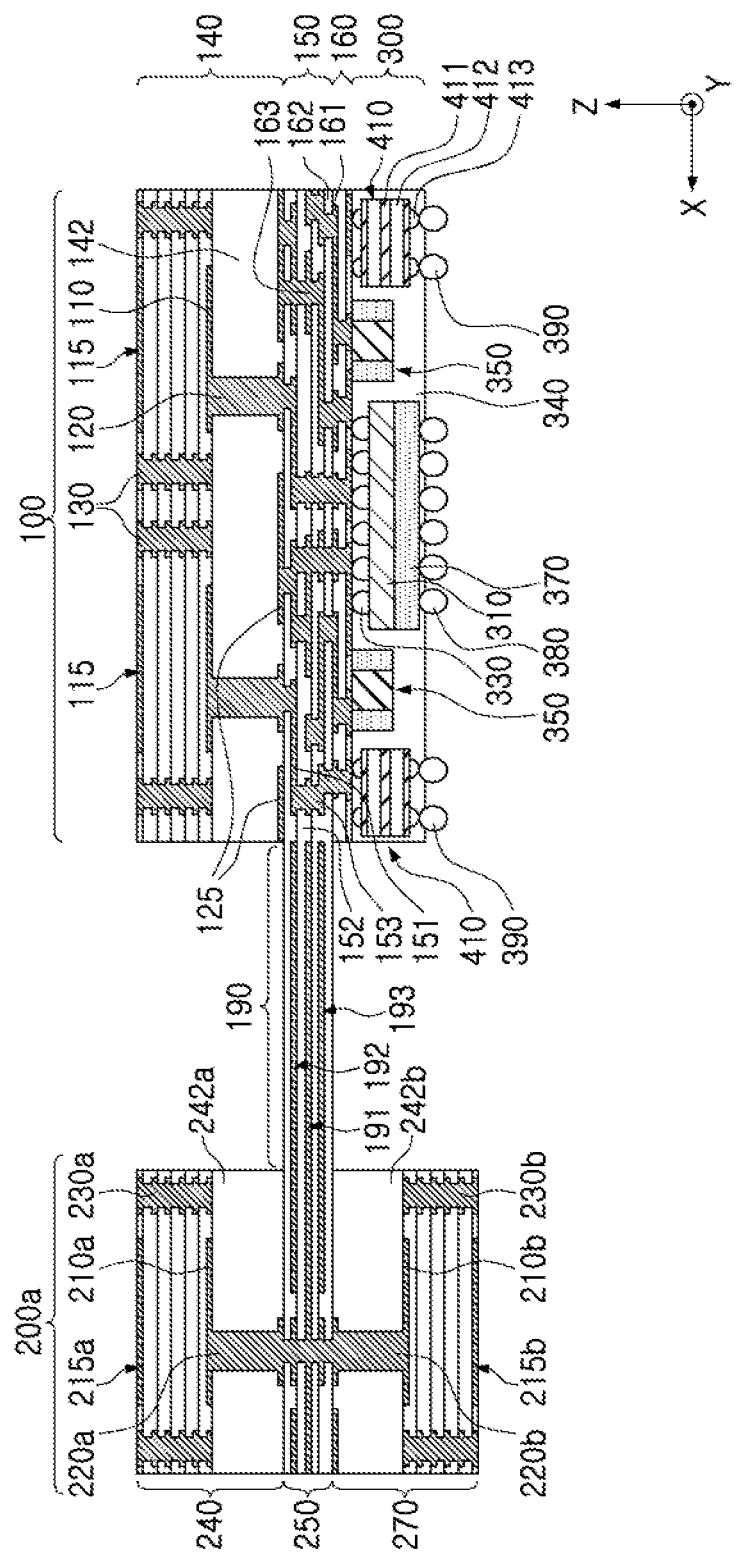
FIG. 2A is a side view illustrating an example of an antenna module and a third antenna package.

FIG. 2A is an example of a side view illustrating an antenna module and a third antenna package in the present disclosure.

Referring to FIG. 2A, the antenna module may further include a third antenna package 270 disposed on a surface (e.g., a lower surface) which is different from a surface (e.g., an upper surface) on which the second antenna package 240 is disposed in the second region 250 of the connection member.

Accordingly, a direction and/or a position of a remote transmission and reception of the RF signal may be designed more freely in the electronic device.

For example, the third antenna package 270 may include a third patch antenna pattern 210b corresponding to the second patch antenna pattern 210a, a third coupling patch pattern 215b corresponding to the second coupling patch pattern 215a, a third feed via 220b corresponding to the second feed via 220a, a third coupling structure 230b corresponding to the second coupling structure 230a, and a third antenna dielectric layer 242b corresponding to the second antenna dielectric layer 242a.

Figure 2B:
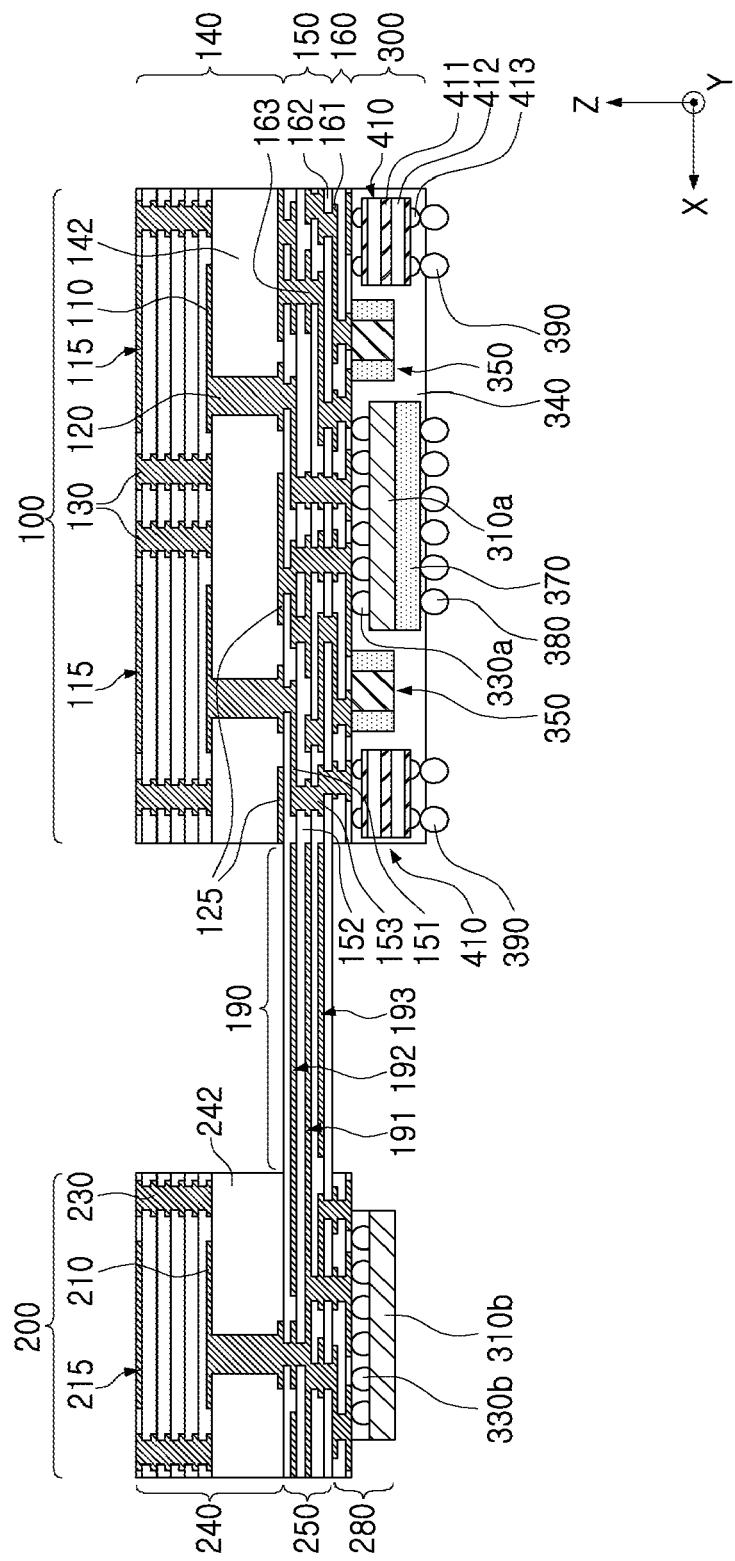
FIG. 2B is a side view illustrating an example of an antenna module and a second integrated circuit (IC) package.

FIG. 2B is an example of a side view illustrating an antenna module and a second integrated circuit (IC) package.

Referring to FIG. 2B, the antenna module may further include a second IC package 280 including a second IC 310b and disposed on a surface (e.g., a lower surface) which is different from a surface (e.g., an upper surface) on which the second antenna package 240 is disposed in the second region 250 of the connection member.

The second IC 310b may correspond to the IC 310a, and may be disposed on the second region 250 of the connection member through second IC electrical connection structures 330b corresponding to the IC electrical connection structures 330a.

Since an electrical length from the second patch antenna pattern 210 to the second IC 310b is shorter than an electrical length from the second patch antenna pattern 210 to the IC 310a, transmission loss of the RF signals which are transmitted and/or received by the second patch antenna pattern 210 may be reduced.

Heat generated in the second IC 310b may be transferred to the mounting electrical connection structures 390 through RF signal expansion path ground layers 192 and 193 of the third region 190 of the connection member. That is, the antenna module according to an example in the present disclosure may maintain or improve the heat dissipating performance of the expansion module 200, which is not mounted on the set substrate.

Figure 2C:
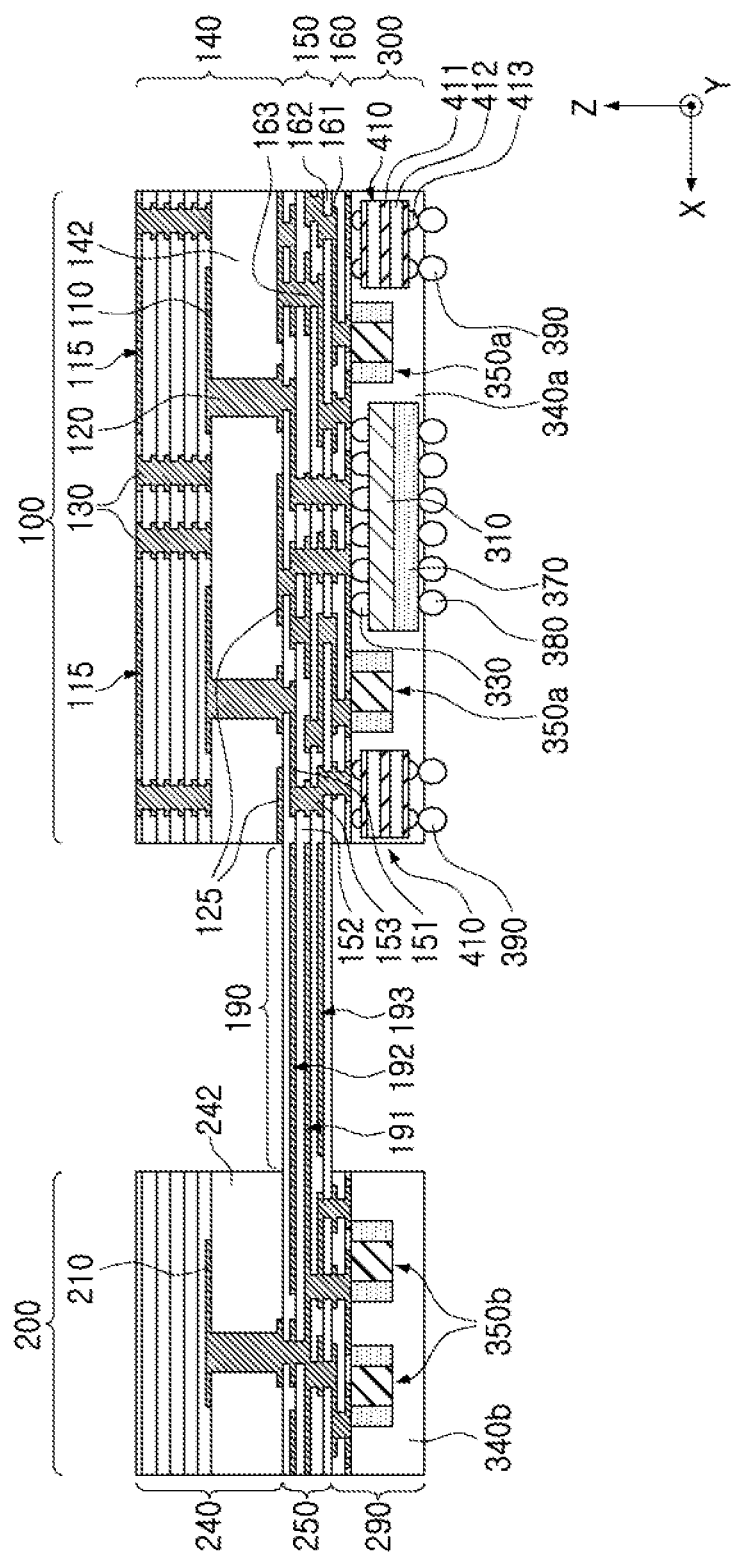
FIG. 2C is a side view illustrating an example of an antenna module and a passive component package.

FIG. 2C is an example of a side view illustrating an antenna module and a passive component package.

Referring to FIG. 2C, the antenna module may include a passive component package 290 including second passive components 350b disposed on a surface (e.g., a lower surface) which is different from a surface (e.g., an upper surface) on which the second antenna package 240 is disposed in the second region 250 of the connection member, and a second encapsulant 340b encapsulating at least portions of the second passive components 350b.

The second passive components 350b may correspond to the first passive components 350a of the IC package 300, and the second encapsulant 340b may correspond to the first encapsulant 340a of the IC package 300.

That is, in the antenna module according to an example in the present disclosure, the arrangement spaces of the passive components may be dispersed into the IC package 300 and the passive component package 290; thus, the antenna module may be easily miniaturized by reducing the size of the IC package 300.

Figure 3A:
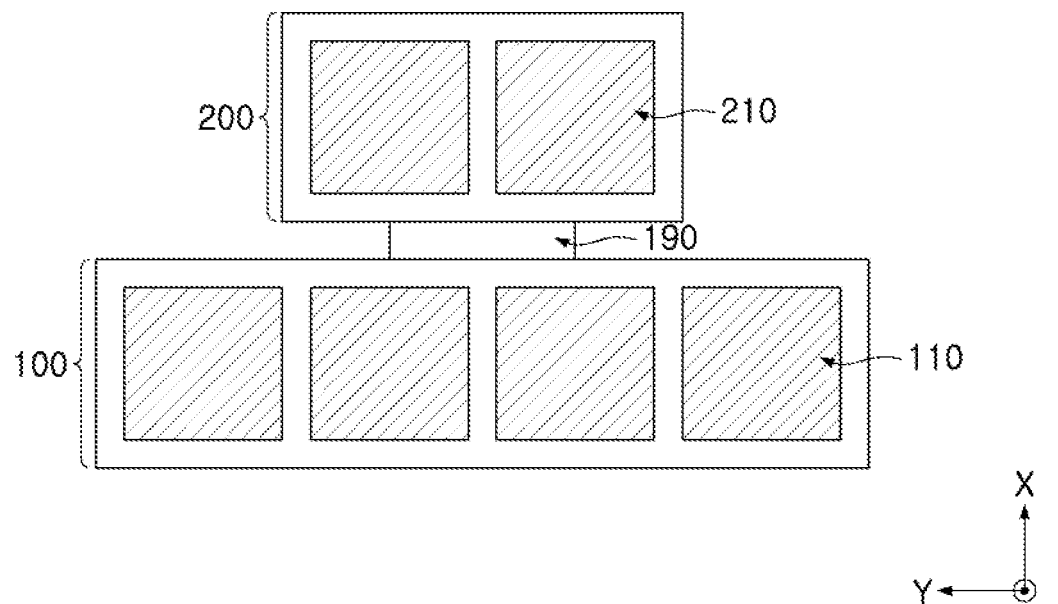
FIGS. 3A and 3B are plan views illustrating examples of an antenna module.
Figure 3B:
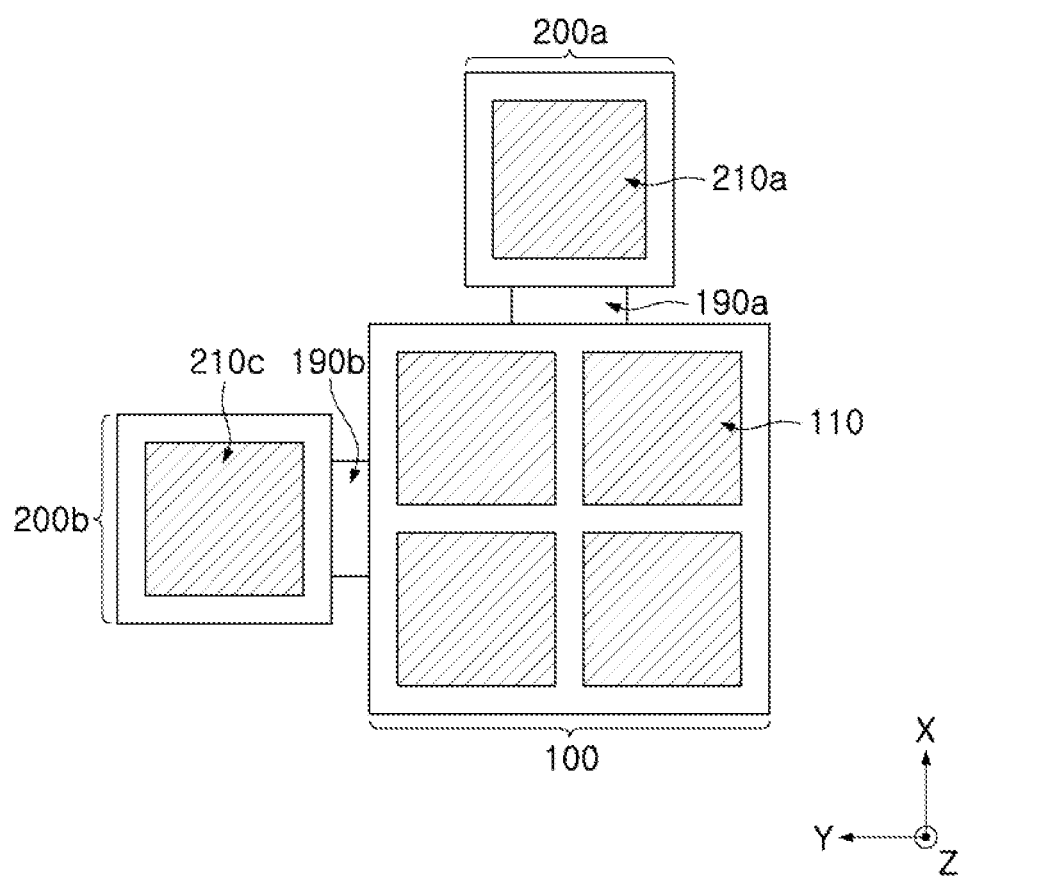

FIGS. 3A and 3B are plan views illustrating examples of an antenna module in the present disclosure.

Referring to FIG. 3A, the expansion module 200 may be expanded and disposed in one of the sides (e.g., an x direction) of the base module 100. The number of the second patch antenna patterns 210 included in the expansion module 200 may be plural.

Referring to FIG. 3B, the antenna module may include first and second expansion modules 200a and 200b. The first expansion module 200a may be electrically connected to the base module 100 through a 3-1-th region 190a of the connection member, and the second expansion module 200b may be electrically connected to the base module 100 through a 3-2-th region 190b of the connection member.

Accordingly, the direction and/or position of a remote transmission and reception of the RF signal in the electronic device may be designed more omnidirectional.

Figure 4A:
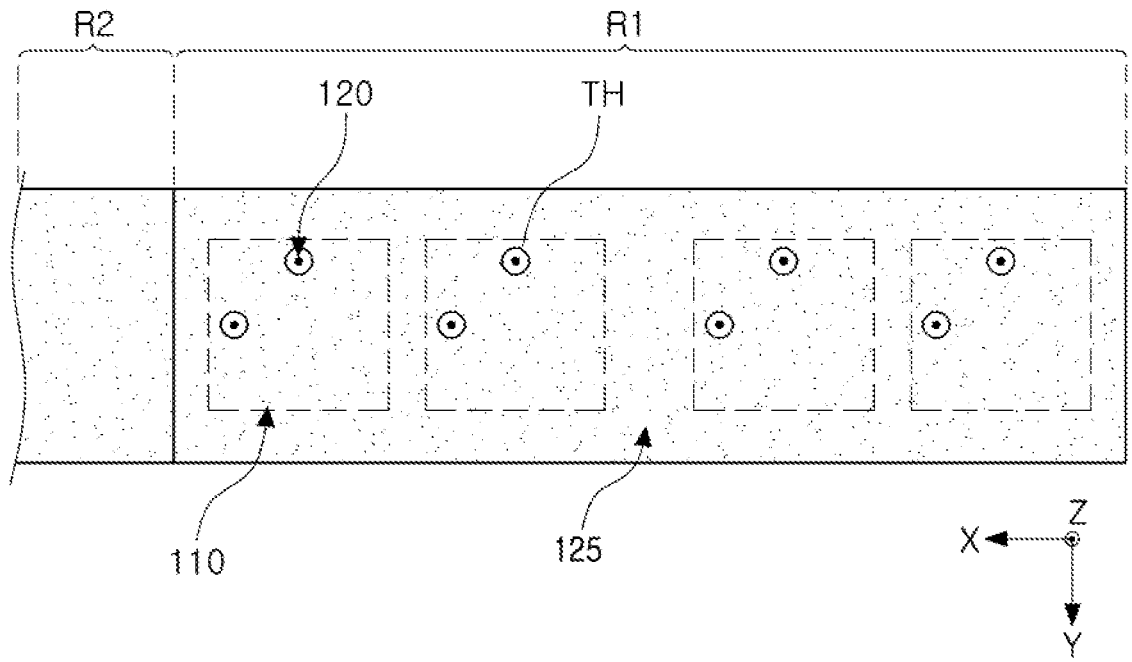
FIGS. 4A and 4B are plan views illustrating an example of a first region and a third region of a connection member of the antenna module.
Figure 4B:
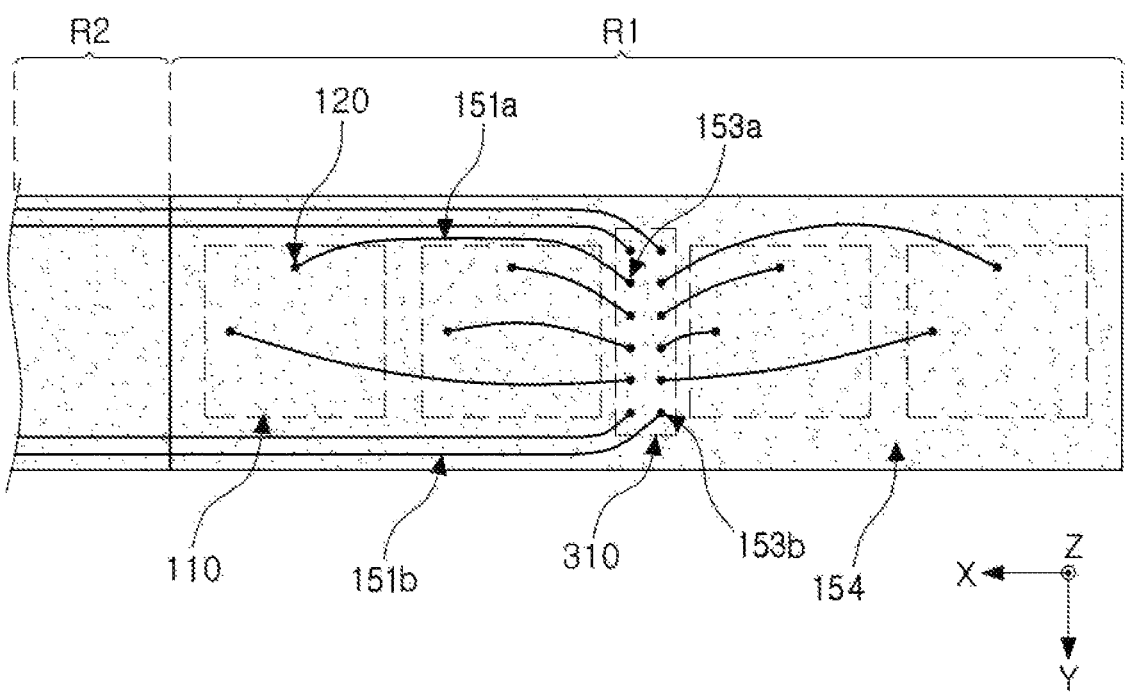

FIGS. 4A and 4B are plan views illustrating an example of a first region R1 and a third region R2 of a connection member of the antenna module.

Referring to FIG. 4A, the first ground layer 125 may include a plurality of through-holes TH, and may be disposed to overlap an arrangement space of the patch antenna pattern 110 in the z direction.

A plurality of feed vias 120 may be disposed to penetrate through the plurality of through-holes TH, respectively.

Referring to FIG. 4B, a wiring ground layer 154 may be disposed closer to the IC than the first ground layer 125 illustrated in FIG. 4A, and may provide an arrangement space of first and second feed lines 151a and 151b. The wiring ground layer 154 may be spaced apart from the first and second feed lines 151a and 151b, and may surround the first and second feed lines 151a and 151b.

The first feed line 151a may electrically connect between the feed via 120 and the first wiring via 153a.

The second feed line 151b may be extended to the third region R2 from the second wiring via 153b, and may be electrically connected to the second patch antenna pattern.

The first and second wiring vias 153a and 153b may be disposed to overlap the arrangement space of the IC 310 in the z direction, and may be electrically connected to the IC 310.

Figure 5A:
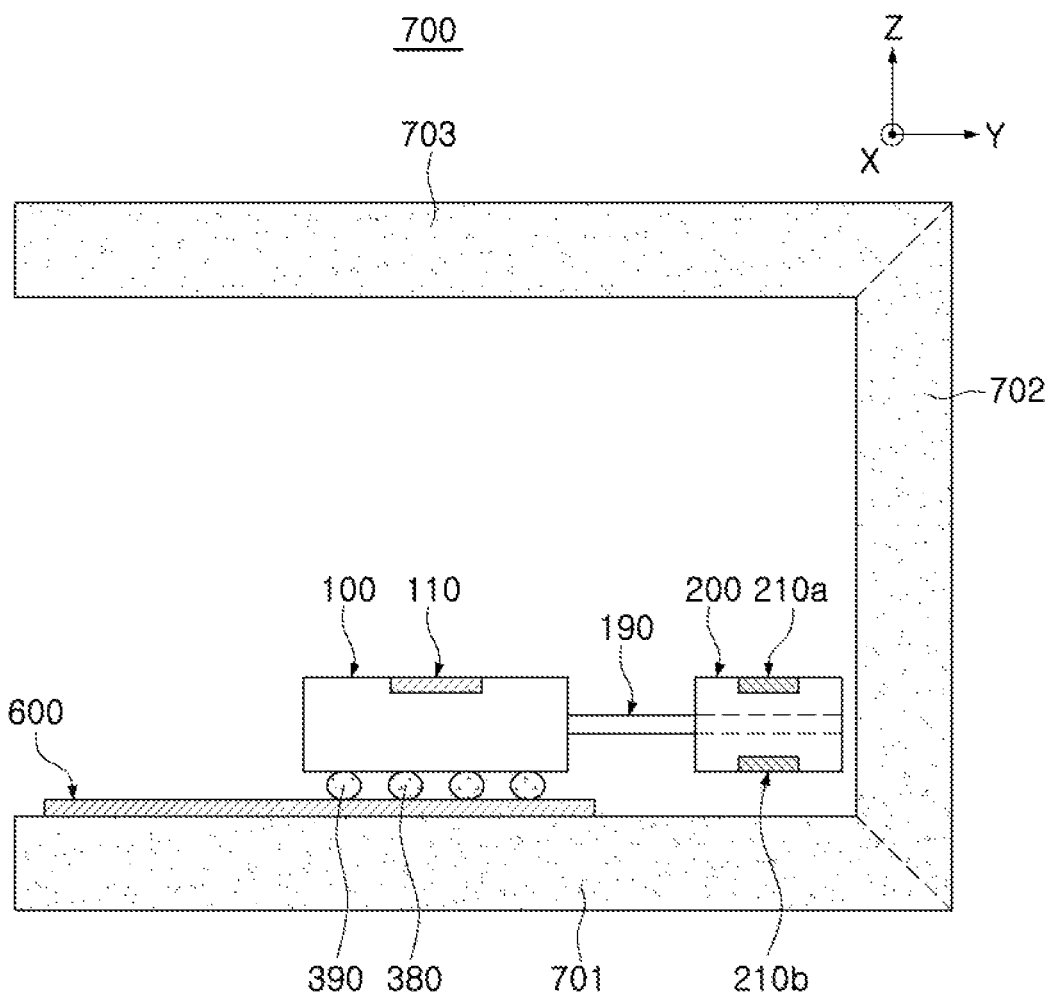
FIGS. 5A through 5C are side views illustrating an example of an antenna module and an electronic device.
Figure 5B:
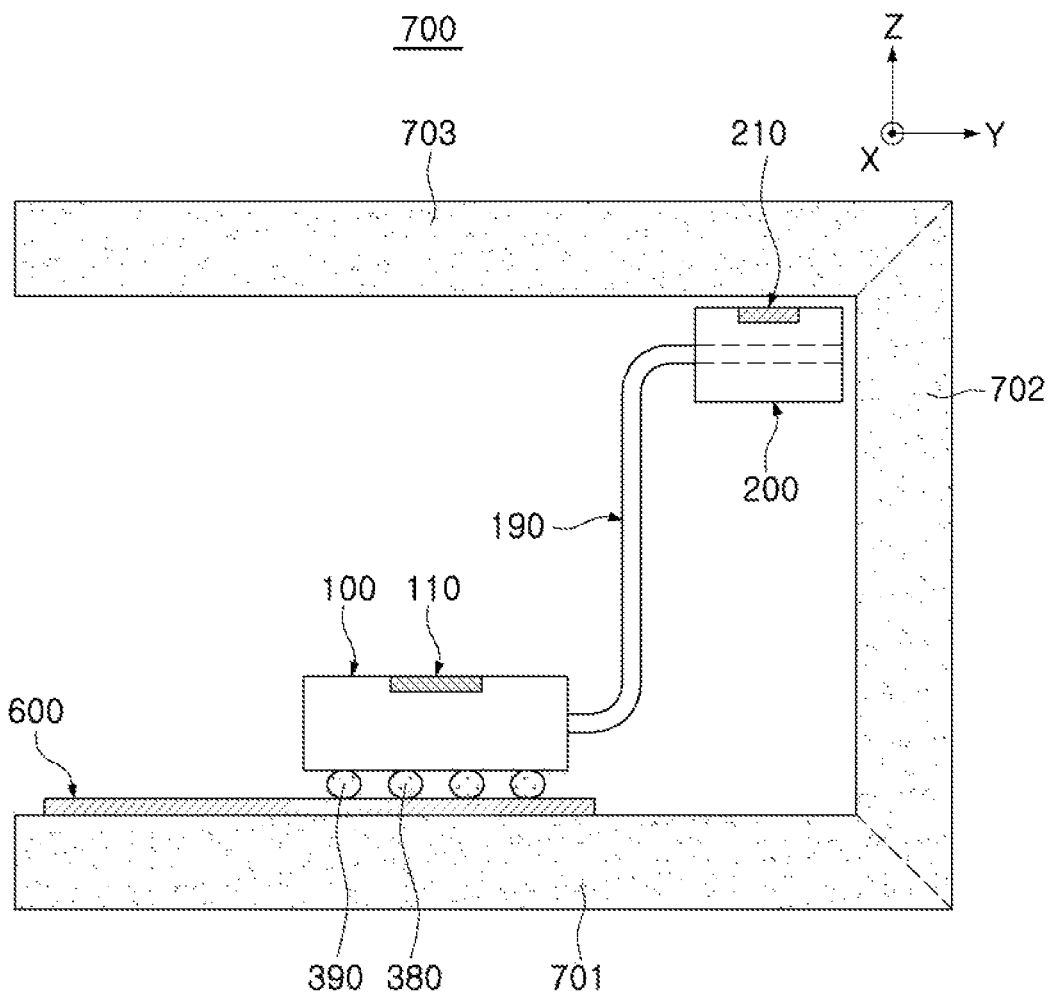
Figure 5C:
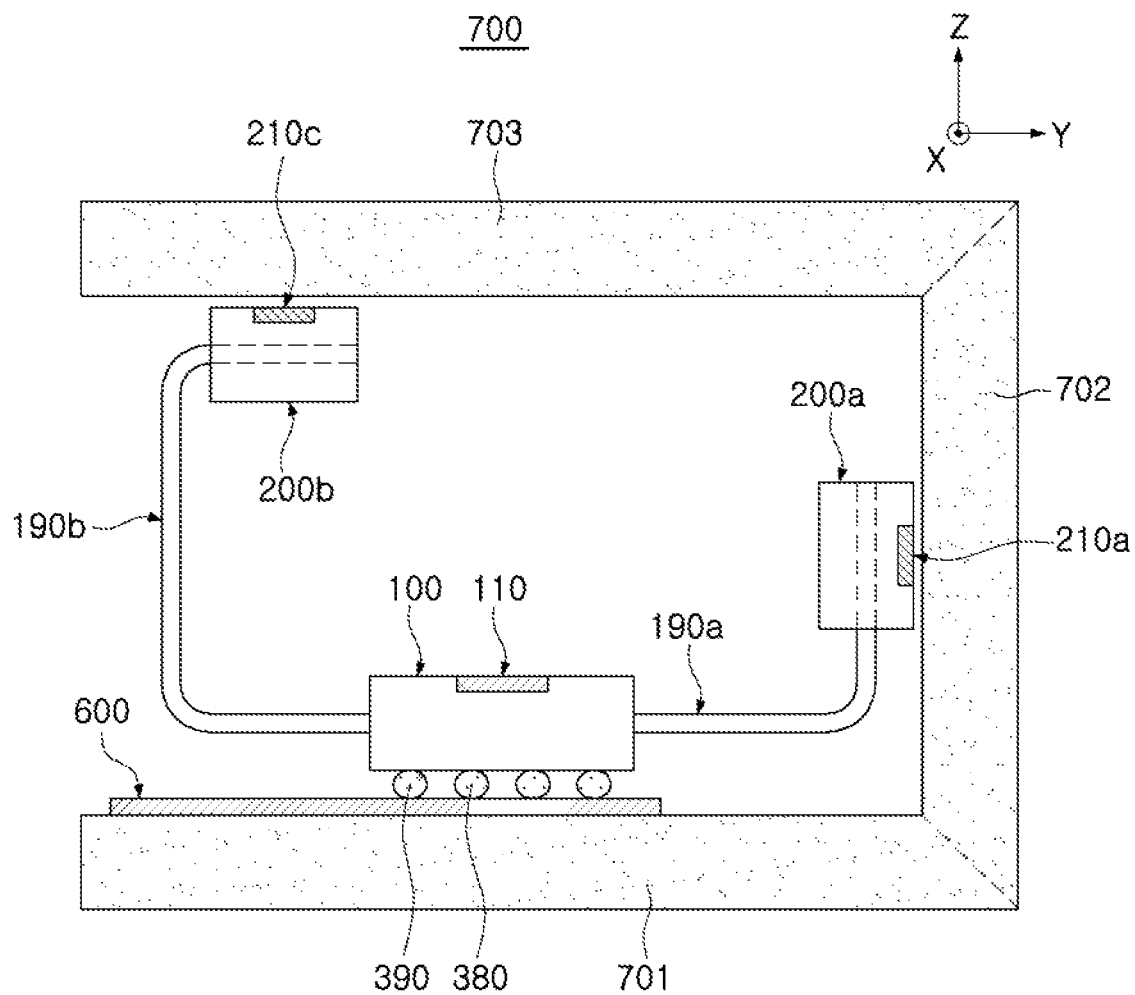

FIGS. 5A through 5C are side views illustrating examples of an antenna module and an electronic device in the present disclosure.

Referring to FIGS. 5A through 5C, an electronic device 700 in the present disclosure may include a case including a first surface 701, a second surface 702, and a third surface 703, and may include a set substrate 600 disposed in the case.

The base module 100 of the antenna module may be mounted on the set substrate 600 through the mounting electrical connection structures 390.

The first patch antenna pattern 110 may be disposed closer to the first surface 701 of the case than the second surface 702 thereof, and the second patch antenna pattern 210a may be disposed closer to the second surface 702 of the case than the first surface 701 thereof.

Accordingly, the probability of the remote transmission and reception of the RF signals of the first and second patch antenna patterns 110 and 210a being obstructed by obstacles (e.g., a display panel, a battery, and the like) in the electronic device or an external obstacle (e.g., a hand of a user) may be reduced.

For example, a plane (e.g., an upper surface) of the first patch antenna pattern 110 and a plane (e.g., an upper surface) of the second patch antenna pattern 210a may be disposed to be directed to the z direction.

Referring to FIG. 5A, the expansion module 200 of the antenna module in the present disclosure may be disposed closer to the first surface 701 of the electronic device 700 than the third surface 703 thereof.

Referring to FIG. 5B, the expansion module 200 of the antenna module in the present disclosure may be disposed closer to the third surface 703 of the electronic device 700 than the first surface 701 thereof.

Referring to FIG. 5C, a direction in which the plane of the first patch antenna pattern 110 is directed may be different from a direction in which the plane of the second patch antenna pattern 210a is directed.

Accordingly, the antenna module and the electronic device in the present disclosure may omnidirectionally utilize a high gain of the patch antenna.

Meanwhile, referring to FIGS. 5A and 5C, third patch antenna patterns 210b and 210c may be disposed on a lower surface of the 3-2-th region 190b of the connection member.

Figure 5D:
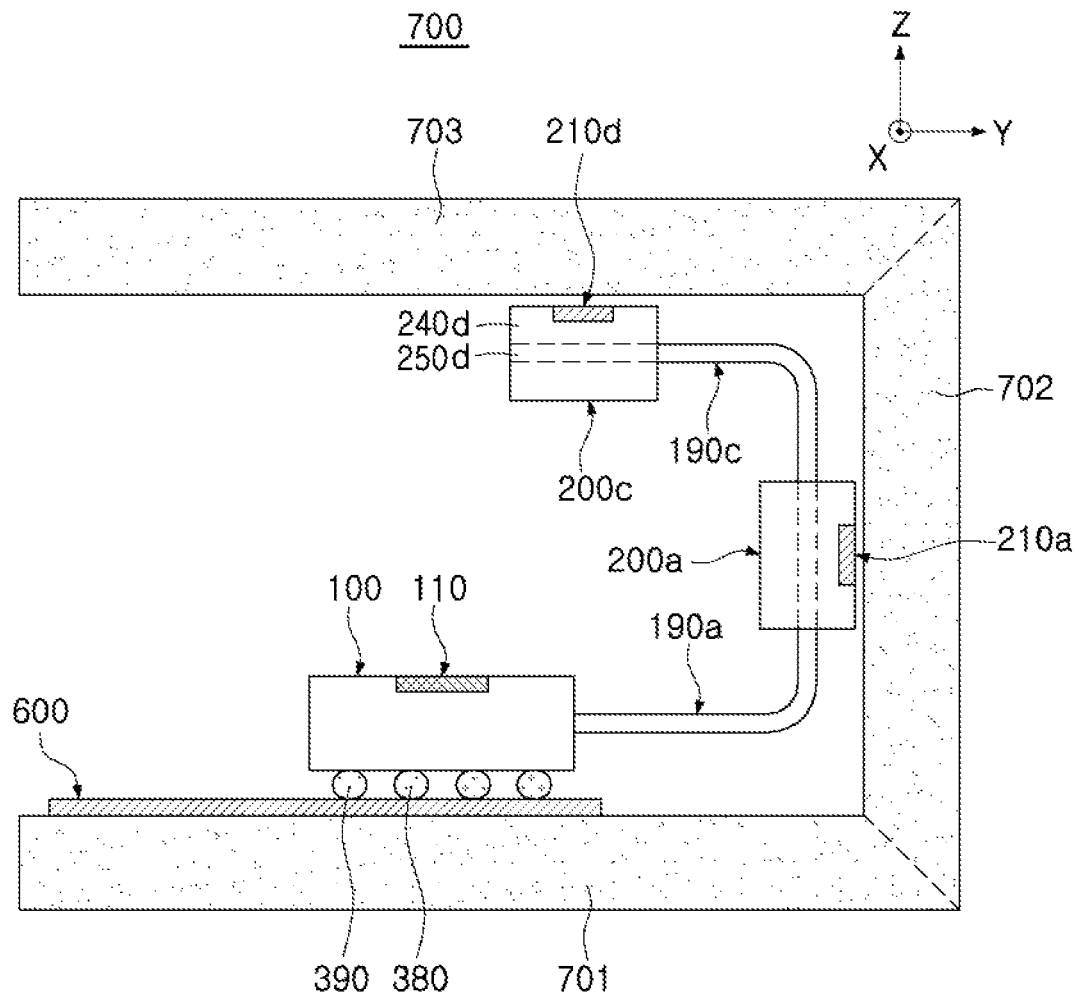
FIG. 5D is a side view illustrating an example of an antenna module, an electronic device, and a fourth antenna package.

FIG. 5D is a side view illustrating an example of an antenna module, an electronic device, and a fourth antenna package in the present disclosure.

Referring to FIG. 5D, the antenna module in the present disclosure may include a third expansion module 200c including a fourth antenna package 240d. The fourth antenna package 240d may include a fourth patch antenna pattern 210d.

Here, the connection member may further include a fourth region 250d providing an arrangement surface of the fourth antenna package 200c, and a fifth region 190c electrically connecting between the fourth region 250d and the second region.

Accordingly, a probability that the remote transmission and reception of the RF signals of the first, second, and fourth patch antenna patterns 110, 210a, and 210d is obstructed by obstacles (e.g., a display panel, a battery, and the like) in the electronic device or an external obstacle (e.g., a hand of a user) may be more easily reduced.

Figure 6A:
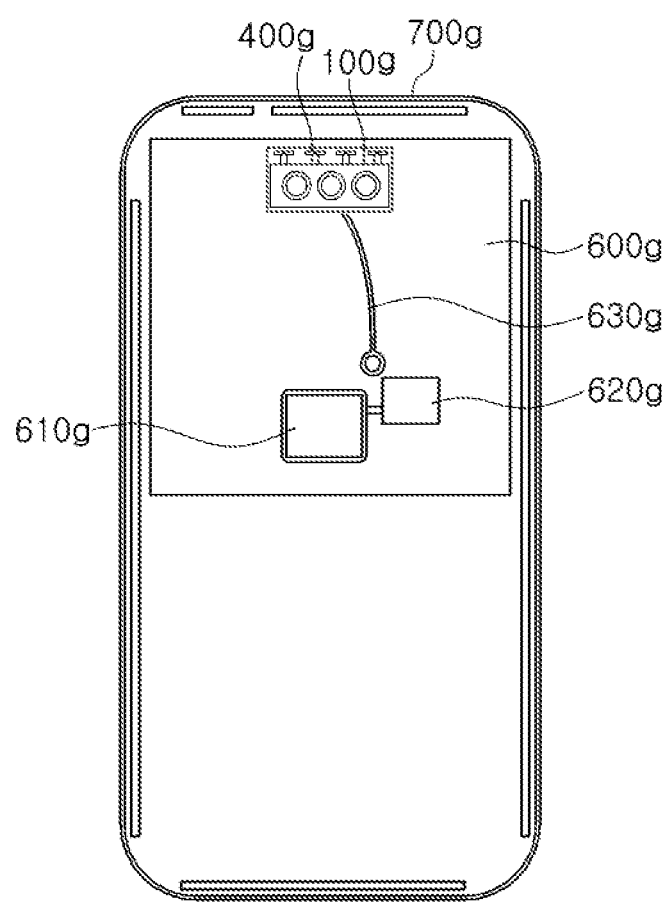
FIGS. 6A and 6B are plan views illustrating examples of an electronic device.
Figure 6B:
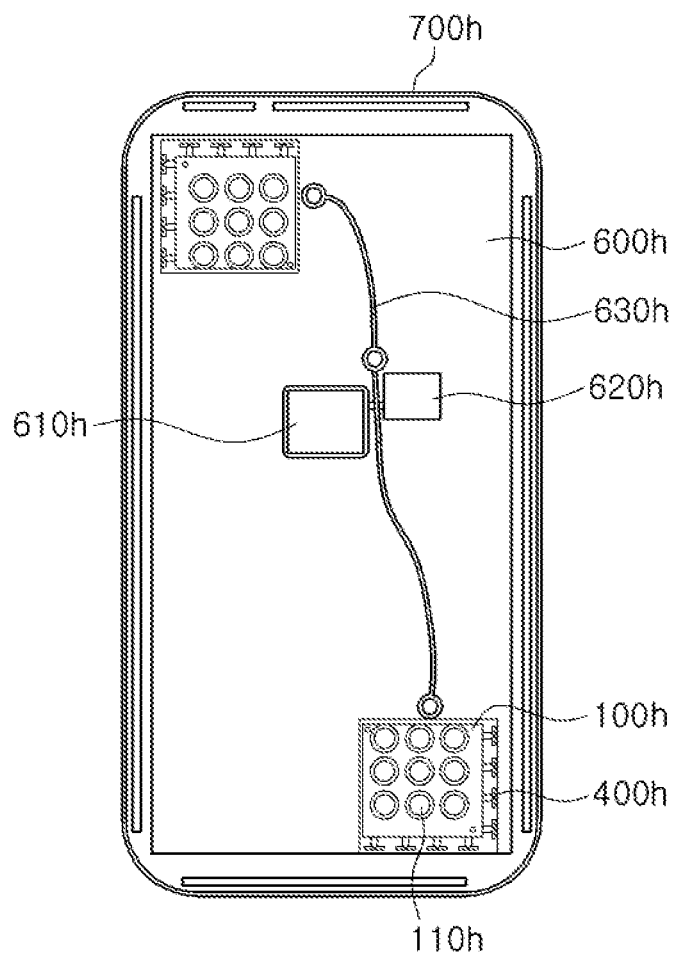

FIGS. 6A and 6B are plan views illustrating examples of an electronic device in the present disclosure.

Referring to FIG. 6A, an antenna module including a base module 100g and an expansion module 400g may be disposed on a set substrate 600g, and may be disposed in an electronic device 700g in the present disclosure.

The electronic device 700g may be a smartphone, a personal digital assistant, a digital video camera, a digital still camera, a network system, a computer, a monitor, a tablet, a laptop, a netbook, a television, a video game, a smart watch, an automotive component, or the like, but is not limited thereto.

A communications module 610g and a second IC 620g may be further disposed on the set substrate 600g. The antenna module may be electrically connected to the communications module 610g and/or the second IC 620g through a coaxial cable 630g.

The communications module 610g may include at least a portion of a memory chip such as a volatile memory (for example, a DRAM), a non-volatile memory (for example, a ROM), a flash memory, or the like; an application processor chip such as a central processor (for example, a CPU), a graphics processor (for example, a GPU), a digital signal processor, a cryptographic processor, a microprocessor, a microcontroller, or the like; and a logic chip such as an analog-digital converter, an application-specific IC (ASIC), or the like to perform a digital signal processing.

The second IC 620g may generate a base signal by performing analog-digital conversion, and amplification, filtering, and frequency conversion of an analog signal. The base signal input and output from the second IC 620g may be transmitted to the antenna module through the coaxial cable. When the base signal is an intermediate frequency (IF) signal, the second IC 620g may be implemented as an intermediate frequency integrated circuit (IFIC). When the base signal is a baseband signal, the second IC 620g may be implemented as a base band integrated circuit (BBIC).

For example, the base signal may be transmitted to the IC through electrical connection structures, a core via, and a circuit wiring. The IC may convert the base signal into an RF signal of a millimeter wave (mmWave) band.

Referring to FIG. 6B, a plurality of antenna modules including a first patch antenna pattern 110h and an expansion module 400, respectively, may be disposed to be adjacent to a boundary of one side surface of an electronic device 700h and a boundary of the other side surface thereof, respectively, on a set substrate 600h of the electronic device 700h. A communications module 610h and a second IC 620h may be further disposed on the set substrate 600h. The plurality of antenna modules may be electrically connected to the communications module 610h and/or the second IC 620h through a coaxial cable 630h.

The patch antenna pattern, the coupling patch pattern, the feed via, the ground layer, the coupling structures, the wiring layer, the wiring vias, the electrical connection structures, the heat slug, and the heat dissipating structures disclosed in the present specification may include a metal material (e.g., a conductive material such as copper (Cu), aluminum (Al), silver (Ag), tin (Sn), gold (Au), nickel (Ni), lead (Pb), titanium (Ti), or an alloy thereof), and may be formed by a plating method such as chemical vapor deposition (CVD), physical vapor deposition (PVD), sputtering, subtractive, additive, semi-additive process (SAP), modified semi-additive process (MSAP), or the like, but are not limited thereto.

The insulating layer disclosed in the present specification may be formed of pregreg, FR4, low temperature co-fired ceramic (LTCC), liquid crystal polymer (LCP), a thermosetting resin such as an epoxy resin, a thermoplastic resin such as polyimide, a resin in which the thermosetting resin or the thermoplastic resin is impregnated together with inorganic filler in a core material such as a glass fiber (a glass cloth or a glass fabric), Ajinomoto Build-up Film (ABF), Bismaleimide Triazine (BT), a photo imagable dielectric (PID) resin, generic copper clad laminate (CCL), or a ceramic based insulating material.

The RF signal disclosed herein may have a format according to wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols, but is not limited thereto. In addition, frequencies (e.g., 24 GHz, 28 GHz, 36 GHz, 39 GHz, and 60 GHz) of the RF signal may be greater than those (e.g., 2 GHz, 5 GHz, 10 GHz, and the like) of the IF signal.

As set forth above, according to the examples in the present disclosure, the antenna module may easily expand the remote transmission and reception direction of the RF signals, and may easily improve the transmission and reception gain and bandwidth of the RF signals in the expansion direction, and/or may not cause a substantial increase in size for the above reasons. Therefore, the antenna module in the present disclosure may improve antenna performance and/or have a structure advantageous for miniaturization.

In addition, the antenna module in the present disclosure may flexibly set the remote transmission and reception positions of the RF signals according to the structure or kind of the electronic device, and may be disposed to reduce a negative influence based on the user's use of the electrode device, thereby improving the antenna performance.

In addition, the antenna module in the present disclosure may efficiently discharge the heat generated in the IC, despite the expansion of the remote transmission and reception direction of the RF signals.

As a non-exhaustive example only, a terminal or device as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An antenna module, comprising:
    an integrated circuit (IC) package including an IC heat dissipating structures and mounting electrical connection structures, wherein the heat dissipating structures and the mounting electrical connection structures are disposed on a same surface of the IC package;
    a first antenna package including a first patch antenna pattern, a first feed via connected to the first patch antenna pattern, and a first antenna dielectric layer surrounding at least a portion of the first feed via;
    a second antenna package including a second patch antenna pattern, a second feed via connected to the second patch antenna pattern, and a second antenna dielectric layer surrounding at least a portion of the second feed via, and disposed to be spaced apart from the first antenna package; and
    a connection member, connecting the IC to the first feed via and the second feed via, connected to the mounting electrical connection structures, and having a stacked structure, the connection member including:
        a first region disposed between the first antenna package and the IC package;
        a second region providing an arrangement surface of the second antenna package; and
        a third region connecting between the first region and the second region.

2. The antenna module of claim 1, wherein a direction in which a plane of the first patch antenna pattern is directed is different from a direction in which a plane of the second patch antenna pattern is directed.

3. The antenna module of claim 1, wherein the connection member includes a signal path dielectric layer that is more flexible than the first antenna dielectric layer.

4. The antenna module of claim 1, further comprising a third antenna package disposed on a surface different from the arrangement surface on which the second antenna package is disposed in the second region of the connection member.

5. The antenna module of claim 1, further comprising a second IC package including a second IC and disposed on a surface different from the arrangement surface on which the second antenna package is disposed in the second region of the connection member.

6. The antenna module of claim 1, further comprising:
    passive components disposed on a surface different from the arrangement surface on which the second antenna package is disposed in the second region of the connection member; and
    an encapsulant encapsulating at least portions of the passive components.

7. The antenna module of claim 1, wherein the IC package further includes a core member providing a surface disposed in the first region of the connection member and another surface on which the mounting electrical connection structures are disposed, and disposed to be spaced apart from the IC.

8. The antenna module of claim 1, wherein the IC package further includes a heat slug disposed on an inactive surface of the IC, and
    the IC is connected to the connection member through an active surface.

9. The antenna module of claim 8, wherein the heat dissipating structures are connected to the heat slug, and
    the heat slug is disposed between the IC and the heat dissipating structures.

10. The antenna module of claim 1, wherein the second antenna package further includes a second coupling structure surrounding at least a portion of the second patch antenna pattern.

11. The antenna module of claim 1, wherein the second antenna package further includes a second coupling patch pattern disposed to be overlapped with the second patch antenna pattern when viewed in a stacked direction of the connection member.

12. An electronic device comprising:
    a set substrate disposed in a case; and
    an antenna module, disposed in the case and connected to the set substrate, comprising:
        an integrated circuit (IC) package including an IC, heat dissipating structures and mounting electrical connection structures, wherein the heat dissipating structures and the mounting electrical connection structures are disposed on a same surface of the IC package;

a first antenna package including a first patch antenna pattern, a first feed via connected to the first patch antenna pattern, and a first antenna dielectric layer surrounding at least a portion of the first feed via;

a second antenna package including a second patch antenna pattern, a second feed via connected to the second patch antenna pattern, and a second antenna dielectric layer surrounding at least a portion of the second feed via, and disposed to be spaced apart from the first antenna package; and a connection member connecting the IC and the first and second feed vias, and having a stacked structure connected to the mounting electrical connection structures, the connection member comprising:

a first region disposed between the first antenna package and the IC package;

a second region providing an arrangement surface of the second antenna package; and a third region connecting between the first region and the second region.

13. The electronic device of claim 12, wherein the IC package further includes a core member disposed between the first region of the connection member and the set substrate, and the mounting electrical connection structures are disposed between the core member and the set substrate.

14. The electronic device of claim 12, wherein the IC package further includes a heat slug disposed between the IC and the set substrate and connected to the set substrate.

15. The electronic device of claim 12, wherein the first patch antenna pattern is disposed closer to a first surface of the case than a second surface of the case, and the second patch antenna pattern is disposed closer to the second surface of the case than the first surface of the case.

16. The electronic device of claim 12, further comprising a fourth antenna package, wherein the connection member further includes:

a fourth region providing an arrangement surface of the fourth antenna package; and a fifth region connecting between the fourth region and the second region.

17. An antenna module, comprising:

a connection member;

a first antenna package including a first patch antenna pattern, a first feed via connected to the first patch antenna pattern, and a first antenna dielectric layer surrounding at least a portion of the first feed via, and disposed on a first surface of the connection member;

a second antenna package including a second patch antenna pattern, a second feed via connected to the second patch antenna pattern, and a second antenna dielectric layer surrounding at least a portion of the second feed via, and disposed on a surface of the connection member to be spaced apart from the first antenna package; and an integrated circuit (IC) package including an IC, heat dissipating structures and mounting electrical connection structures, and disposed on a second surface of the connection member, wherein the heat dissipating structures and the mounting electrical connection structures are disposed on a same surface of the IC package, wherein the second surface is opposite the first surface, and wherein the connection member connects the IC to the first feed via and the second feed via, and connects to the mounting electrical connection structures.

18. The antenna module of claim 17, wherein the connection member has a stacked structure.

19. The antenna module of claim 17, wherein the second antenna package is disposed on the first surface of the connection member.

20. The antenna module of claim 19, wherein a direction in which a plane of the first patch antenna pattern is directed is different from a direction in which a plane of the second patch antenna pattern is directed.

* * * * *